United States Patent
Jenq et al.

[19]

[11] Patent Number: 6,140,201
[45] Date of Patent: Oct. 31, 2000

[54] METHOD FOR FABRICATING A CYLINDER CAPACITOR

[75] Inventors: J. S. Jason Jenq, Pingtung; Sun-Chieh Chien; Der-Yuan Wu, both of Hsinchu; Chuan-Fu Wang, Taipei Hsien, all of Taiwan

[73] Assignee: United Microelectronics Corp., Hsinchu, Taiwan

[21] Appl. No.: 09/172,407

[22] Filed: Oct. 14, 1998

[30]     Foreign Application Priority Data

Aug. 6, 1998 [TW] Taiwan ................................ 87112947

[51] Int. Cl.$^7$ .................................................. H01L 21/20
[52] U.S. Cl. ........................... 438/396; 438/253; 438/639
[58] Field of Search ................................. 438/239, 253, 438/396, 397, 639, 446, 240, 254, 255, 256, 398, 399

[56]              References Cited

U.S. PATENT DOCUMENTS

| | | | |
|---|---|---|---|
| 5,294,561 | 3/1994 | Tanigawa ................................. | 438/253 |
| 5,323,038 | 6/1994 | Gonzalez et al. ........................ | 257/308 |
| 5,459,091 | 10/1995 | Hwang ..................................... | 438/257 |
| 5,543,345 | 8/1996 | Liaw et al. ............................... | 438/397 |
| 5,946,566 | 8/1999 | Choi ......................................... | 438/329 |
| 5,946,571 | 8/1999 | Hsue et al. ............................... | 438/255 |
| 6,001,682 | 12/1999 | Chien ....................................... | 438/239 |

*Primary Examiner*—Carl Whitehead, Jr.
*Assistant Examiner*—Jeff Vockrodt
*Attorney, Agent, or Firm*—Thomas, Kayden, Horstemeyer & Risley

[57]               ABSTRACT

A method for fabricating a cylinder capacitor of a DRAM cell that starts with forming a first oxide layer and then a doped first polysilicon layer on a substrate, patterning the first polysilicon layer to form a first opening that exposes the first oxide layer, forming a polysilicon spacer at the laterals of the first opening. Then, a portion of the first oxide layer is removed to expose the substrate by using the polysilicon spacer and the first polysilicon layer as a mask. A doped second polysilicon layer is formed on the first polysilicon layer and in the first opening. A portion of the second polysilicon layer is removed to form a second opening. A oxide spacer is formed on the laterals of the second opening, and is used as mask to remove a portion of the second polysilicon layer for forming a lower electrode. A dielectric layer and then a third polysilicon layer are formed on the lower electrode after the silicon oxide spacer is removed, wherein the third polysilicon is an upper electrode.

16 Claims, 6 Drawing Sheets

METHOD FOR FABRICATING A CYLINDER CAPACITOR

CROSS-REFERENCE TO RELATED APPLICATION

This application claims the priority benefit of Taiwan application serial no. 87112947, filed Aug. 6, 1998 the full disclosure of which is incorporated herein by reference.

BACKGROUND OF THE INVENTION

1. Field of the Invention

This invention relates to semiconductor fabrication process, and more particularly, to a method for fabricating a cylinder capacitor.

2. Description of Related Art

A dynamic random access memory (DRAM) is used to replace a conventional static random access memory (SRAM) to increase the integration of a memory circuit, and has been widely used in computer related industrials. Different from a memory cell in a SRAM, which stores data by its state of conductivity, a memory cell in a DRAM stores data by utilizing the state of charging of a capacitor.

As the development of microprocessors and software applications is advancing, a higher capacity of memory is also required to execute those advanced applications. However, for a conventional DRAM, as the integration of a DRAM circuit is increased, that is, the transistors are downsized, it becomes difficult to maintain an acceptable signal-to-noise ratio at storing charges into a capacitor. Even though reducing the capacitance of each capacitor in a DRAM cell is able to raise the signal-to-noise ratio, but the refreshing rate of each memory cell has to be increased accordingly.

Speaking of a signal memory cell of a DRAM, it contains at least a field effect transistor (FET) and a capacitor in order to store a bit of binary data. As referring to FIG. 1, a memory cell consists of a transistor 10 and a capacitor 11. To the transistor 10, the source of the transistor is connected to a corresponding bit line 12, the gate is connected to a corresponding word line 13, and the drain is connected to the storage electrode 14, or a so-called lower electrode, of a capacitor 11. The plate electrode 15, or a so-called upper electrode or a cell electrode, of the capacitor 11 is connected to a voltage source. Between the upper and lower electrodes, there is a dielectric layer 16 for storing charges.

Since the size of a capacitor is limited by the dimension of a memory cell, different structures, such as a trench capacitor, a cylinder capacitor, and a stack capacitor, are used to increase the capacitance of a capacitor without further occupying the substrate horizontally. Among the foregoing structures, the most commonly used are the cylinder capacitor and the stack capacitor that are designed to extend the storage electrode upward vertically for increasing the capacitance of the capacitor.

The fabrication process of a conventional cylinder capacitor is shown in the cross-sectional views of FIGS. 2A through 2G.

As shown in FIG. 2A, a oxide layer 21 and a silicon nitride layer 22 are formed on a substrate 20 in sequence, wherein the substrate 20 already contains a metal-oxide-semiconductor (MOS) transistor.

Referring to FIG. 2B, the silicon nitride layer 22 and the oxide layer 21 are patterned to form an opening 23 that exposes the substrate 20. Then, a conducting layer 24, polysilicon, is deposited on the silicon nitride layer 22 and filled in the opening 24. The polysilicon on the top of the silicon nitride layer 22 is removed by performing an etching back process, so that the top surface of the polysilicon layer 24 and the top of the silicon nitride layer 22 are coplanar, as shown in FIG. 2C.

Referring next to FIG. 2D, a oxide layer 25 is formed on the top of the silicon nitride layer 22 and the polysilicon layer 24, and patterned to form an opening 26, wherein the opening 26 exposes the polysilicon layer 24. Another conducting layer 27 is deposited conformal to the oxide layer 25 the opening 26, wherein the conducting layer 27 is electrically connected to the polysilicon layer 24 underneath. The entire foregoing structure is then covered by an oxide layer 28.

Referring to FIGS. 2E and 2F, a portion of the oxide layer 28 and the conducting layer 27 are removed by performing several etching processes to form a lower electrode of a capacitor that consists of the remaining conducting layer 27 and the polysilicon layer 24.

Referring next to FIG. 2G, a dielectric layer 29 and another conducting layer 30 are deposited on the substrate 20 in sequence to cover the structure on the substrate 20, wherein the conducting layer 30 is used as an upper electrode of a capacitor.

Since the size of a DRAM cell is decreased according to the increased integration of a DRAM, the amount of charges stored in a capacitor is also decreased. In the case that a capacitor of a DRAM cell cannot hold a certain amount of charges, the occurrence of soft errors due to the incident α-ray is increased as well. Therefore, it has been an objective to maintain the capacitance of a capacitor in a DRAM cell, in the mean time, also to downsize the device.

In the foregoing step of forming the opening 23, which includes patterning conventional photoresist on the oxide layer, tends toward causing defects such as blind contact due to the limitation of the exposure resolution.

SUMMARY OF THE INVENTION

It is therefore an objective of the present invention to provide a method for fabricating a cylinder capacitor of a DRAM cell that resolve the problems happening in a conventional fabricating method caused by the limitation of exposure resolution.

In accordance with the foregoing and other objectives of the present invention, the invention provides a method for fabricating a cylinder capacitor of a DRAM cell that resolves the problem, which is caused by the limitation of exposure resolution, with the assistance of polysilicon spacers. The cylinder capacitor formed by the method according to the invention has a higher capacitance.

The method according to the invention starts with forming a first oxide layer and then a doped first polysilicon layer on a substrate, patterning the first polysilicon layer to form a first opening that exposes the first oxide layer, forming a polysilicon spacer at the laterals of the first opening. Then, a portion of the first oxide layer is removed to expose the substrate by using the polysilicon spacer and the first polysilicon layer as a mask. A doped second polysilicon layer is formed on the first polysilicon layer and in the first opening. A portion of the second polysilicon layer is removed to form a second opening. A oxide spacer is formed on the laterals of the second opening, and is used as mask to remove a portion of the second polysilicon layer for forming a lower electrode. A dielectric layer and then a third polysilicon layer are formed on the lower electrode after the silicon oxide spacer is removed, wherein the third polysilicon is an upper electrode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating a cylinder capacitor as shown in FIGS. 3A through 3G.

Figure 1:
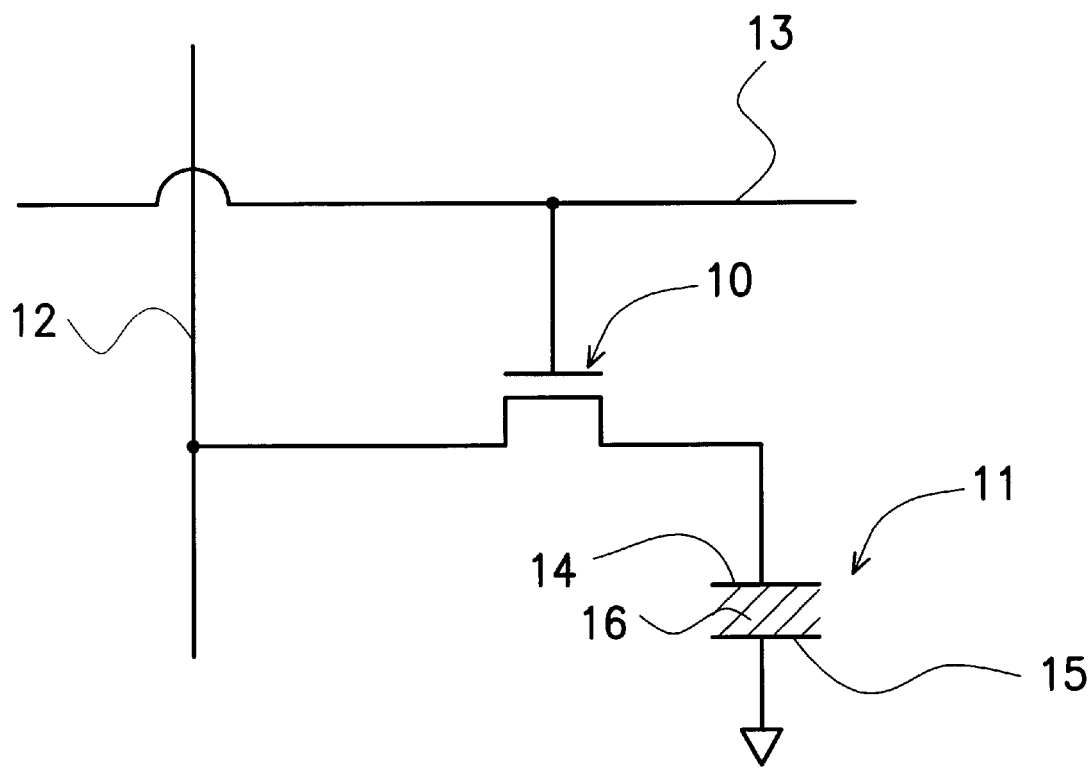
FIG. 1 is a schematic diagram showing the circuit of a DRAM memory cell.
Figure 2A:
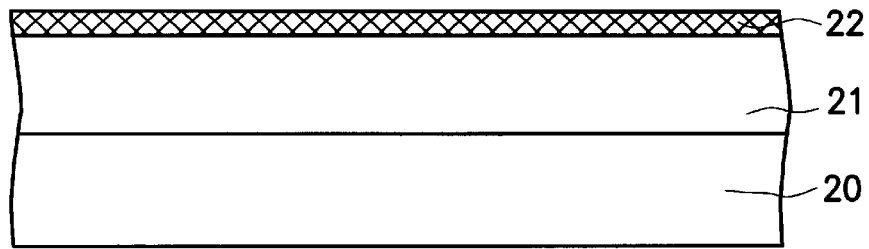
FIGS. 2A through 2G are cross-sectional views showing the fabrication of a conventional cylinder capacitor.
Figure 2B:
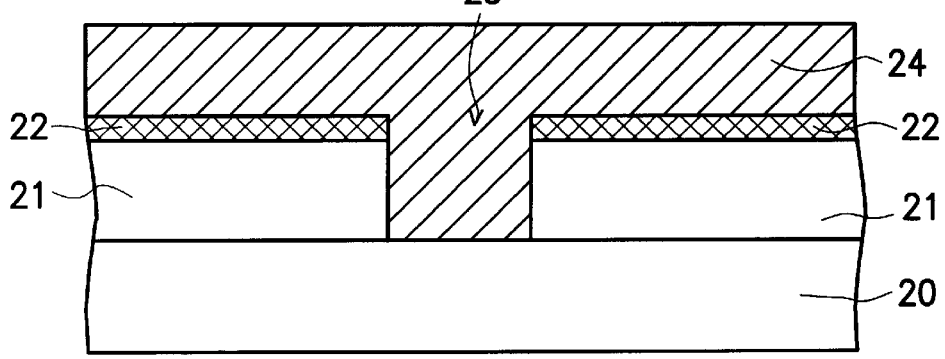
Figure 2C:
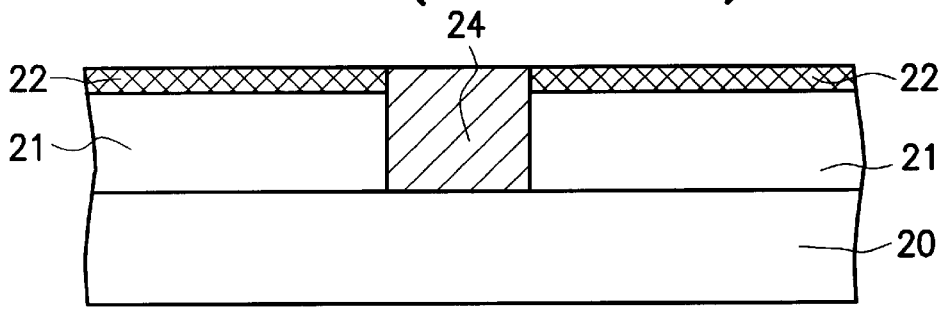
Figure 2D:
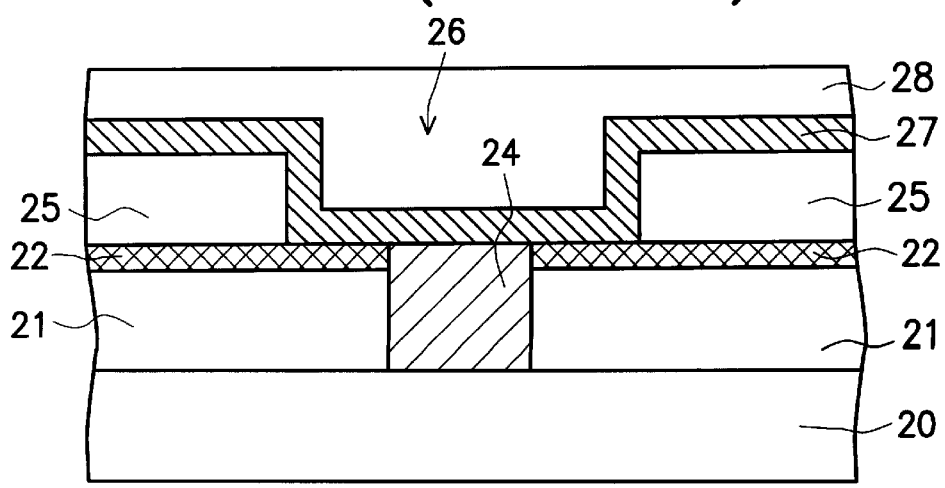
Figure 2E:
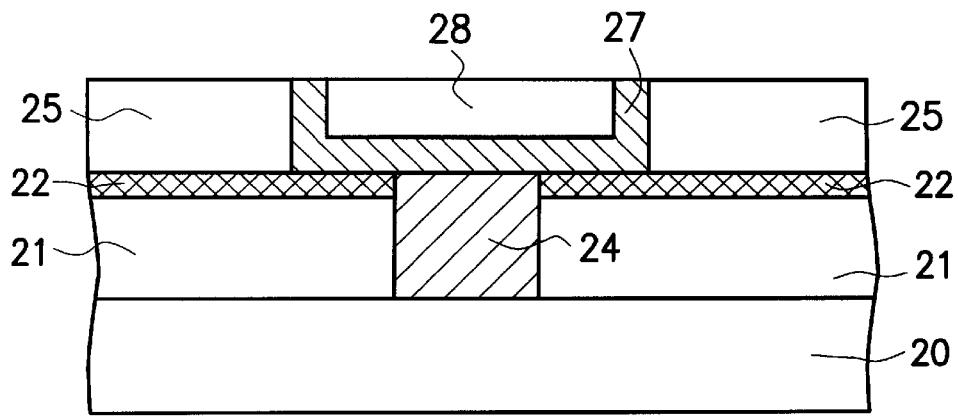
Figure 2F:
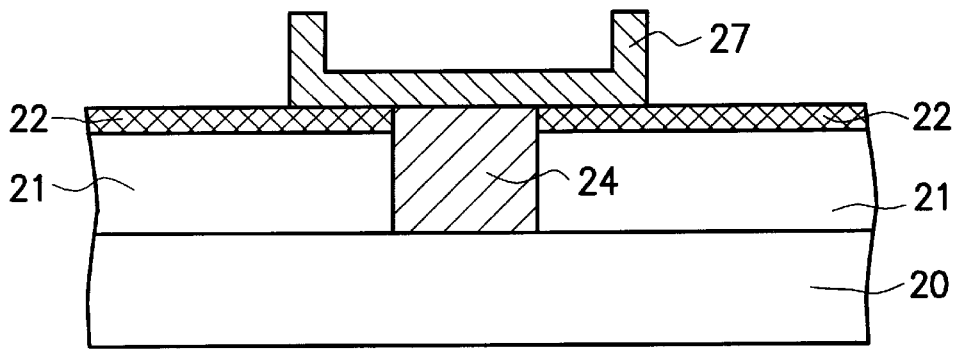
Figure 2G:
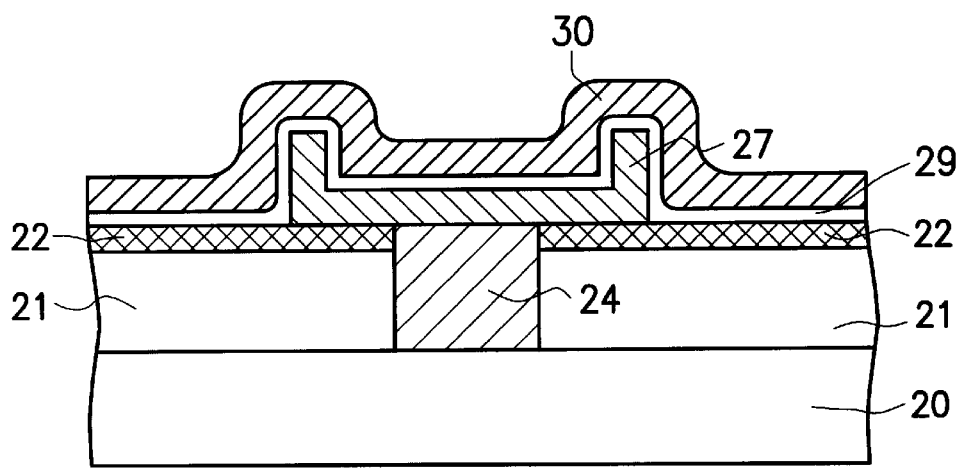
Figure 3A:
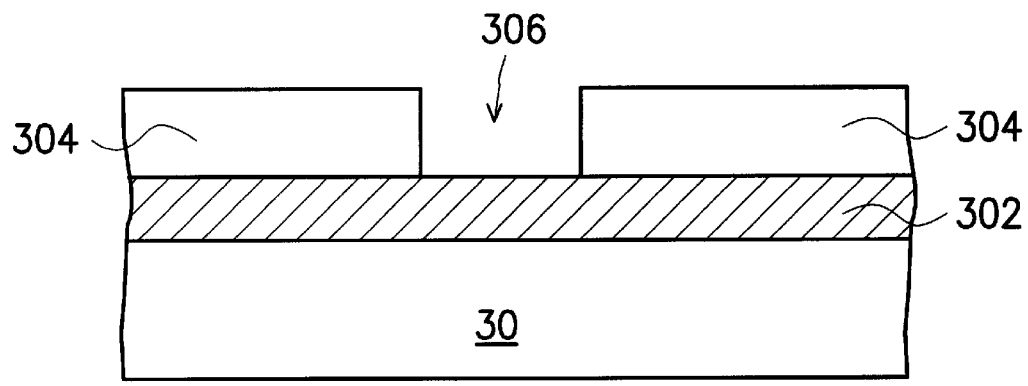
FIGS. 3A through 3G are cross-sectional views showing the fabrication of a cylinder capacitor in a preferred embodiment according to the invention.

Referring to FIG. 3A, an oxide layer 302, which is about 2000 Å, is formed on a provided substrate 30, wherein the substrate 30 already contains a preformed metal-oxide-semiconductor (MOS) transistor (not shown in figure). The oxide layer 302, for example, is a tetra-ethyl-ortho-silicate (TEOS) layer formed by low-pressure chemical vapor deposition (LPCVD). A first doped polysilicon layer 304 is deposited on the oxide layer 302, wherein the thickness of the first doped polysilicon layer 304 is about 5000 Å. By performing photolithography and etching processes, an opening 306 is formed on the first doped polysilicon layer 304, wherein the opening 306 exposes the oxide layer 302 beneath.

Figure 3B:
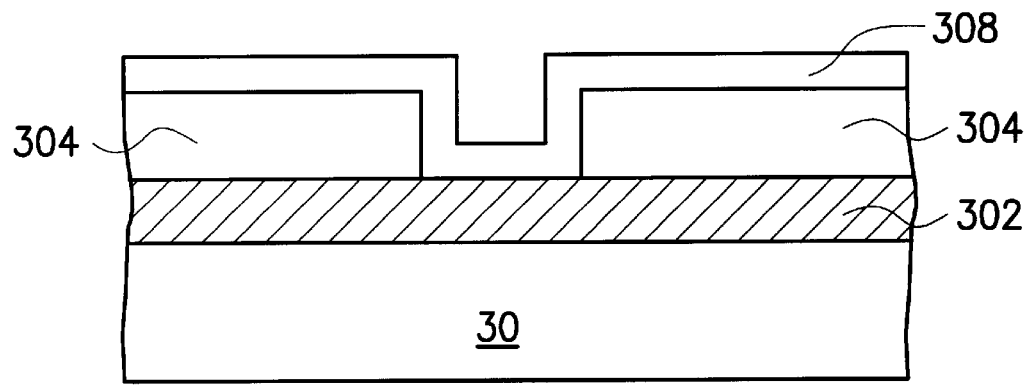

Referring next to FIG. 3B, a second doped polysilicon layer 308 is deposited on the first doped polysilicon layer 304 and in the opening 306, wherein the thickness of the second doped polysilicon layer 308 is about 500 to 1000 Å.

Figure 3C:
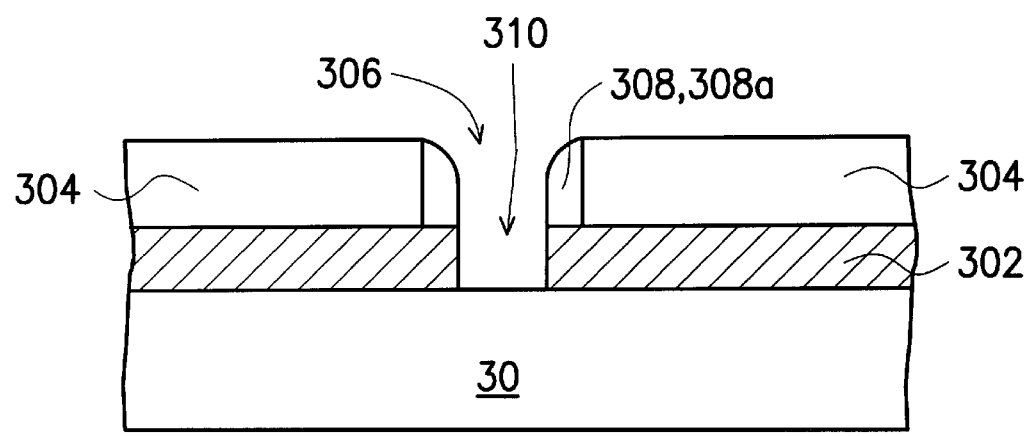

Referring to FIG. 3C, by performing an etching process, a portion of the second doped polysilicon layer 308 located on the top of the first doped polysilicon layer 304 and on the bottom of the opening 306 is removed. The remaining second doped polysilicon layer 308a becomes a polysilicon spacer located on the laterals of the opening 306. By using the polysilicon layer 308a, which has a higher optical resolution than conventional oxide spacer, as a mask, a portion of the oxide layer 302 is removed to form a contact opening 310 that exposes the substrate 30. The exposed substrate 30 includes a doped region of a MOS transistor (not shown in figure).

Figure 3D:
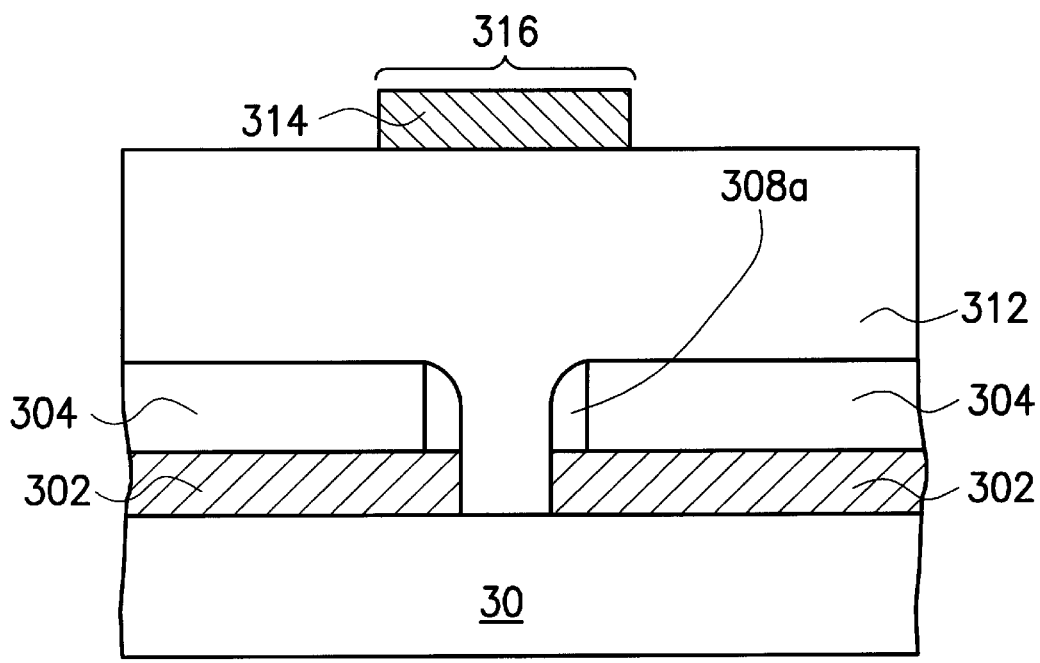

Referring next to FIG. 3D, a third doped polysilicon layer 312 is deposited on the first doped polysilicon layer 304 and in the opening 310, wherein the thickness of the third polysilicon layer 312 is about 5000 Å. On the third doped polysilicon layer 312, a patterned photoresist layer 314 is formed for defining the region 316 reserved for forming a cylinder capacitor.

Figure 3E:
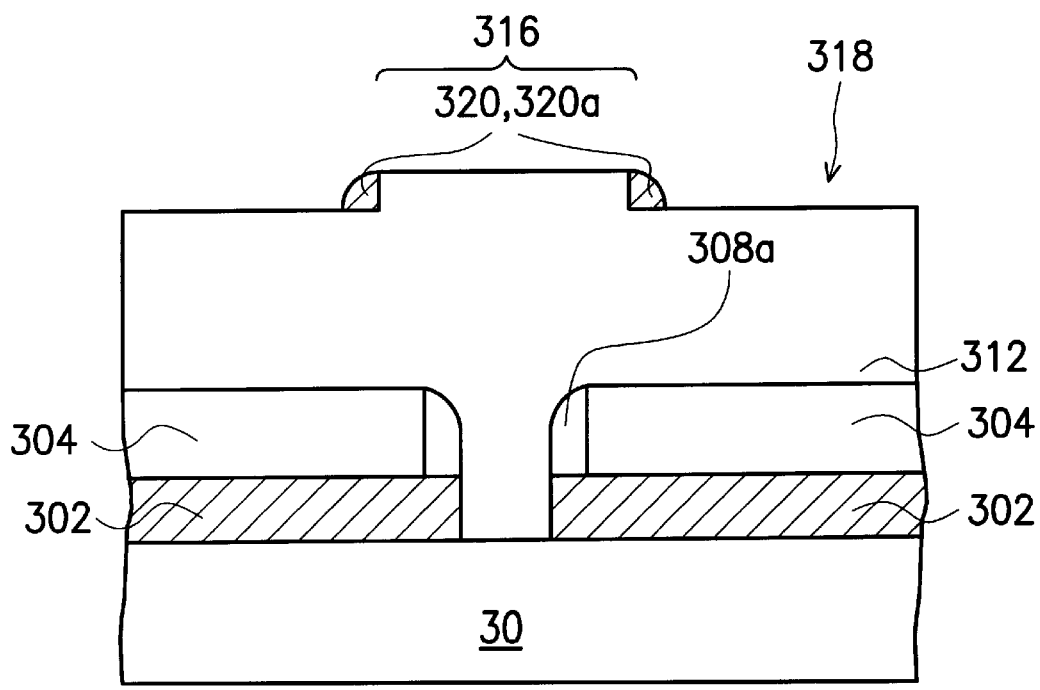

Referring to FIG. 3E, a portion of the third doped polysilicon layer 312 that is not covered by the photoresist layer 314 is etched to a predetermined depth to form an opening 318. After the photoresist layer 314 is removed, a oxide layer 320 of a thickness equal to about 1000 Å is formed on the third doped polysilicon layer 312, by a method such as LPCVD, wherein the oxide layer 320 is TEOS or other materials of the similar property. The oxide layer 320 is sequentially etched to form a spacer 320a on the laterals of the opening 318.

Figure 3F:
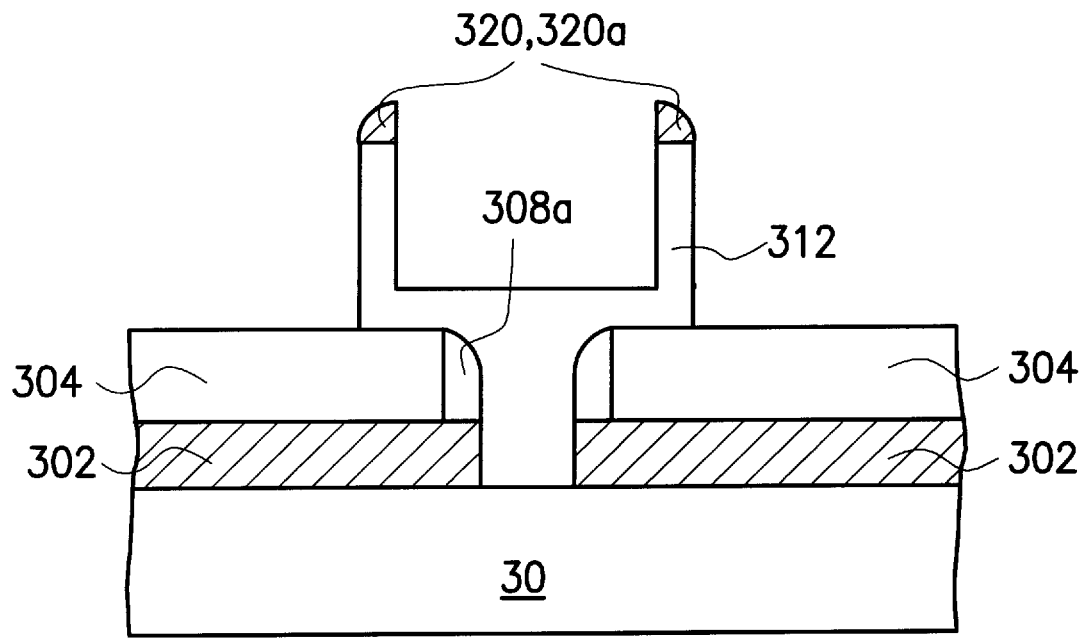

Referring next to FIG. 3F, a selective etching process is performed to remove a portion of the third doped polysilicon layer 312 that is not covered by the spacer 320a by using the first doped polysilicon layer 304 as an etching end point. Since the region 316 of the third doped polysilicon layer 312 is thicker than others before the etching process is performed, there is a remaining thickness of the third doped polysilicon layer 312 within the region 316. The remaining third doped polysilicon layer 312 is a lower electrode 322 of a cylinder capacitor.

Figure 3G:
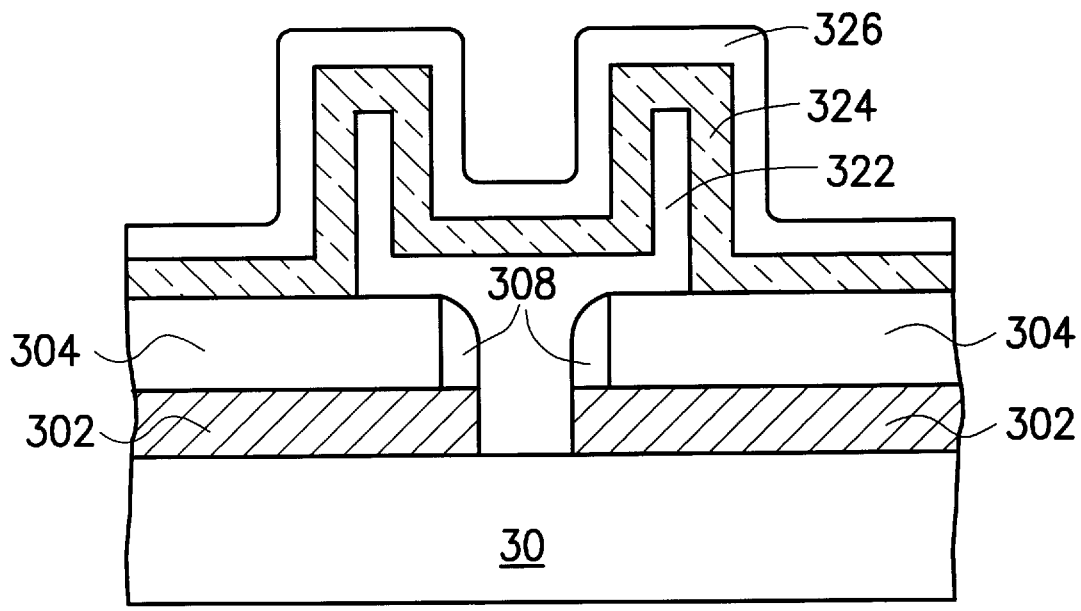

Referring to FIG. 3G, the spacer 320a is removed after the formation of the lower electrode 322, by such as a dry etching process. A dielectric layer 324, such as oxide/nitride/oxide (ONO), is formed on the first doped polysilicon layer 304 and covers the lower electrode 322. A polysilicon layer 326 is then deposited on the dielectric layer 324 as an upper electrode of a cylinder capacitor, wherein the thickness of the polysilicon layer 326 is about 1000 Å.

According to the foregoing, the specificity of the invention is using polysilicon spacer instead of a conventional oxide spacer as a etching mask for improving the optical resolution to overcome the problem happening in a conventional method.

Another specificity of the invention is using a oxide spacer to remove a portion of the polysilicon layer to form a lower electrode of a cylinder capacitor, wherein the cylinder capacitor has a higher capacitance regarding to the larger lower electrode.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a cylinder capacitor of a dynamic random access memory on a provided substrate, the method comprising:

forming a first oxide layer on the provided substrate;

forming a doped first polysilicon layer on the first oxide layer;

patterning the first polysilicon layer without removing the first oxide layer to form a first opening, wherein the first opening exposes the first oxide layer;

forming a doped second polysilicon layer on the first polysilicon layer exposed in the first opening;

removing a portion of the second polysilicon layer, wherein a remaining portion of the second polysilicon layer forms a first spacer on lateral sides of the first opening;

removing a portion of the first oxide layer exposed within the first opening to form a contact opening, wherein the contact opening exposes the provided substrate;

forming a doped third polysilicon layer on the second polysilicon layer and in the contact opening;

forming a photoresist layer on the third polysilicon layer for patterning a region reserved for forming the cylinder capacitor;

etching a portion of the third polysilicon layer outside the photoresist layer to a predetermined depth to form a second opening;

removing the photoresist layer;

forming a second oxide layer on the third polysilicon layer;

removing a portion of the second oxide layer, wherein the remaining second oxide layer forms a second spacer;

performing a selective etching process on the third polysilicon layer by using the first polysilicon layer as an etching end point to form a lower electrode;

removing the second spacer;

depositing a dielectric layer on the lower electrode; and depositing a forth polysilicon layer on the dielectric as an upper electrode.

2. The method of claim 1, wherein the first oxide layer includes tetra-ethyl-ortho-silicate formed by low-pressure chemical vapor deposition.

3. The method of claim 1, wherein the first oxide layer is about 2000 Å thick.

4. The method of claim 1, wherein the step of forming a doped first polysilicon layer includes a deposition process, and wherein the first polysilicon layer is about 5000 Å thick.

5. The method of claim 1, wherein the step of patterning the first polysilicon layer includes performing a photolithography and etching process to remove a portion of the first polysilicon layer.

6. The method of claim 1, wherein the second polysilicon layer is about 500 to 1000 Å thick.

7. The method of claim 1, wherein the third polysilicon layer is about 5000 Å thick.

8. The method of claim 1, wherein the second oxide layer is about 1000 Å thick.

9. The method of claim 1, wherein the step of forming a second oxide layer includes low-pressure chemical vapor deposition.

10. The method of claim 1, wherein the step of removing a portion of the second oxide layer includes an etching process.

11. The method of claim 1, wherein the region of the third polysilicon layer that is reserved for forming the cylinder capacitor is higher than the rest of the polysilicon layer in the step of performing a selective etching process on the third polysilicon layer.

12. The method of claim 11, wherein the region of the third polysilicon layer that is reserved for forming the cylinder capacitor remains a thickness after the step of performing a selective etching process on the third polysilicon layer.

13. The method of claim 1, wherein the step of removing the second spacer includes a dry etching process.

14. The method of claim 1, wherein the dielectric layer includes oxide/nitride/oxide.

15. The method of claim 1, wherein the fourth polysilicon layer is about 1000 Å thick.

16. A method for forming a cylinder capacitor of a semiconductor device on a provided substrate, the method comprising:

forming a first oxide layer on the provided substrate;

forming a doped first polysilicon layer on the first oxide layer;

patterning the first polysilicon layer without removing the first oxide layer to form a first opening, wherein the first opening exposes the first oxide layer;

forming a first spacer on lateral sides of the first opening;

removing a portion of the first oxide layer exposed within the first opening to form a contact opening, wherein the contact opening exposes the provided substrate;

forming a doped second polysilicon layer on the first spacer and in the contact opening;

forming a photoresist layer on the second polysilicon layer for patterning a region reserved for forming the cylinder capacitor;

removing a portion of the second polysilicon layer not covered by the photoresist layer to a predetermined depth to form a second opening;

removing the photoresist layer;

forming an oxide spacer on a lateral side of the second opening;

performing a selective etching process on the second polysilicon layer by using the first polysilicon layer as an etching end point to form a lower electrode;

removing the oxide spacer;

depositing a dielectric layer on the lower electrode; and depositing a third polysilicon layer on the dielectric layer as an upper electrode.

* * * * *